United States Patent
Bruccoleri et al.

[19]

[11] Patent Number: 5,808,488
[45] Date of Patent: Sep. 15, 1998

[54] TIMED BISTABLE CIRCUIT FOR HIGH FREQUENCY APPLICATIONS

[75] Inventors: Melchiorre Bruccoleri; Paolo Cusinato, both of Genoa, Italy

[73] Assignee: SGS-Thomson Microelectronics S.r.l., Agrate Brianza, Italy

[21] Appl. No.: 755,466

[22] Filed: Nov. 22, 1996

[30] Foreign Application Priority Data

Nov. 23, 1995 [EP] European Pat. Off. .............. 95830487

[51] Int. Cl.⁶ ......................... H03K 5/153; H03K 3/356
[52] U.S. Cl. ........................ 327/57; 327/208; 327/210; 327/211
[58] Field of Search .................................... 327/199, 200, 327/201, 208–215, 52–57, 97, 218

[56] References Cited

U.S. PATENT DOCUMENTS

| | | | |
|---|---|---|---|
| 4,461,965 | 7/1984 | Chin ......................................... | 307/530 |
| 4,539,495 | 9/1985 | Demier .................................... | 307/530 |
| 5,532,628 | 7/1996 | Viswanathan ............................ | 327/57 |
| 5,625,308 | 4/1997 | Matsumoto et al. ..................... | 327/52 |

FOREIGN PATENT DOCUMENTS

A-0 639 000 2/1995 European Pat. Off. ....... H03K 3/037

OTHER PUBLICATIONS

European Search Report from European Patent Application No. 95830487.5, filed Nov. 23, 1995.
IBM Technical Disclosure Bulletin, vol. 28, No. 4, Sep. 1, 1985, New York, US, pp. 1716–1718, "Latching Node Clock Design in Half VDD Bit Line CMOS Sense Amplifier".

*Primary Examiner*—Margaret Rose Wambach
*Assistant Examiner*—T. T. Lam
*Attorney, Agent, or Firm*—Wolf, Greenfield & Sacks, P.C.; James H. Morris

[57] ABSTRACT

A timed bistable circuit is described which includes two inverters each having its input connected to the output of the other, an output of the circuit via a "buffer" and an input of the circuit via a controlled electronic switch. The supply terminals of the inverters are connected to the supply terminals of the circuit via another two controlled switches. A clock generator provides timing signals to control both the input switches to open or close and to control the supply switches to close or open when the input switches are open or closed respectively. To obtain a latch usable in a comparator at a high comparison frequency the offset referred to the input is reduced and made independent of the frequency by arranging two further electronic switches between the supply terminals of the inverters and the supply terminals which are controlled by a timing signal in such a way as to close with a predetermined delay with respect to the closure of the input switches and to open when input switches open.

5 Claims, 4 Drawing Sheets

5,808,488

TIMED BISTABLE CIRCUIT FOR HIGH FREQUENCY APPLICATIONS

BACKGROUND OF THE INVENTION

1. Field of the Invention

The present invention relates to a timed bistable circuit (latch), advantageously usable in a comparator circuit having a high frequency response.

2. Discussion of the Related Art

As is known, the most typical function of a comparator circuit is that of comparing between voltages applied to its inverting and non-inverting input terminals. The output of the comparator is either a voltage at logic level 1 when the voltage on the non-inverting input is greater than that on the inverting input or a voltage at logic level 0 when the voltage on the non-inverting input is less than that on the inverting input.

In order to obtain high comparison speeds, where high frequency response characteristics are required, comparators are used which incorporate timed bistable circuits (latches) that have a high commutation speed due to the positive feedback on which their operation is based.

A typical comparator of this type is constituted, as shown in FIG. 1, by a differential preamplifier stage DIF, a latch LAT timed by a clock circuit CK and an output stage FF constituted by a "master-slave" RS-type flip-flop. The inputs Vin and Vref of the differential stage are the inputs of the comparator and one of the outputs of the flip-flop, Q' or Q' is the output of the comparator. The differential preamplifier stage DIF must have a gain such that the smallest difference Vin−Vref which must be sensed is amplified by a factor sufficient to obtain at the input to the latch a signal with an amplitude higher than the offset referred to the input. As is known, the input offset voltage of a differential circuit is the voltage which must be applied to the inputs to have a voltage difference equal to zero between the outputs of the circuit and is a quantity which depends on asymmetry and unbalancing of the components of the circuit. For the comparator of FIG. 1 the offset voltage referred to the input is expressed by $$V_{OS} \cong V_{OSDIF} + \left(\frac{V_{OSL}}{A_{DIF}}\right)$$

where $V_{OSDIF}$ is the offset of the differential stage DIF, $V_{OSL}$ is the offset of the latch LAT and $A_{DIF}$ is the gain of the differential preamplifier stage DIF.

In order to obtain a comparator having output levels which are as sharp, stable and in the case of integrated circuit structures, as reproducible as possible from one example to another it is necessary to minimize the input offset voltage. Moreover, in order to obtain comparators which have the most uniform possible response even at high comparison frequencies, it is necessary that the offset voltage does not depend on frequency. In practice, however, known latches have an offset voltage $V_{OSL}$ which increases considerably with an increase in the frequency at which they are operated. Consequently, the increase in offset voltage limits the response of the comparator at high frequencies.

SUMMARY OF THE INVENTION

An object of the present invention is to provide a timed bistable circuit (latch) having a reduced offset which is substantially independent of the timing frequency.

These and other objects are achieved by a timed bistable circuit having two supply terminals;

a first and a second signal input;

a first and a second signal output; a first and a second inverter each having its input connected to the output of the other inverter, to the first and the second signal output respectively via a first and a second separator circuit respectively and to the first and second signal input respectively via a first and a second controlled electronic switch respectively and each having two supply terminals connected to the circuit supply terminals via first controlled switch means;

timing means operable to control the first and the second electronic switch to open or close simultaneously and to control the first controlled switch means to close or open when the first and second electronic switches are both open or both closed respectively, second controlled switch means operable to connect the two supply terminals of the inverters respectively to the first and to the second circuit supply terminal, and wherein the timing means are operable to control the second switch means to close with a predetermined delay with respect to the closure of the first and second electronic switches and to open at a predetermined instant not later than the opening of the first and second electronic switches.

According to another embodiment of the invention, the predetermined instant coincides with the opening of the first and second electronic switches.

According to another embodiment of the invention, the first controlled switch means include third and fourth controlled electronic switches and the second controlled switch means include fifth and sixth controlled electronic switches.

According to another embodiment of the invention, the controlled electronic switches include transfer gates.

According to another embodiment of the invention, a differential amplifier is connected to the inputs of the timed bistable circuit and a flip flop is connected to the outputs of the timed bistable circuit, the inputs of the differential amplifier being the inputs of the comparator and one of the inputs of the flip flop being the output of the comparator.

BRIEF DESCRIPTION OF THE DRAWINGS

The invention will be better understood from the following detailed description of an embodiment given in relation to the attached drawings, in which.

DETAILED DESCRIPTION

Figure 1:
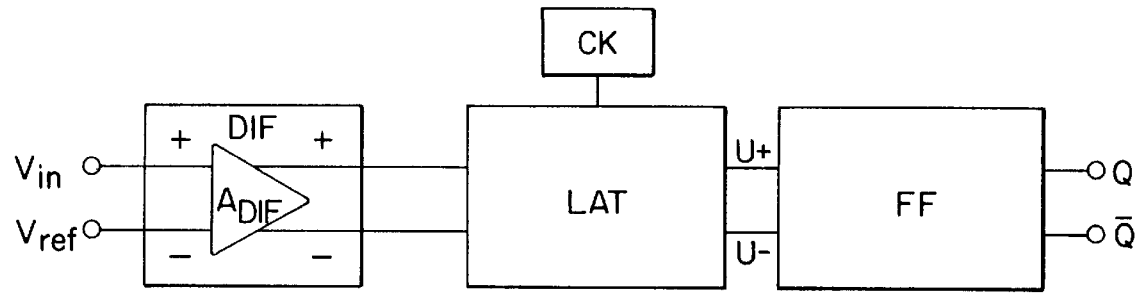
FIG. 1 is a block diagram of a generic comparator with a latch.
Figure 2:
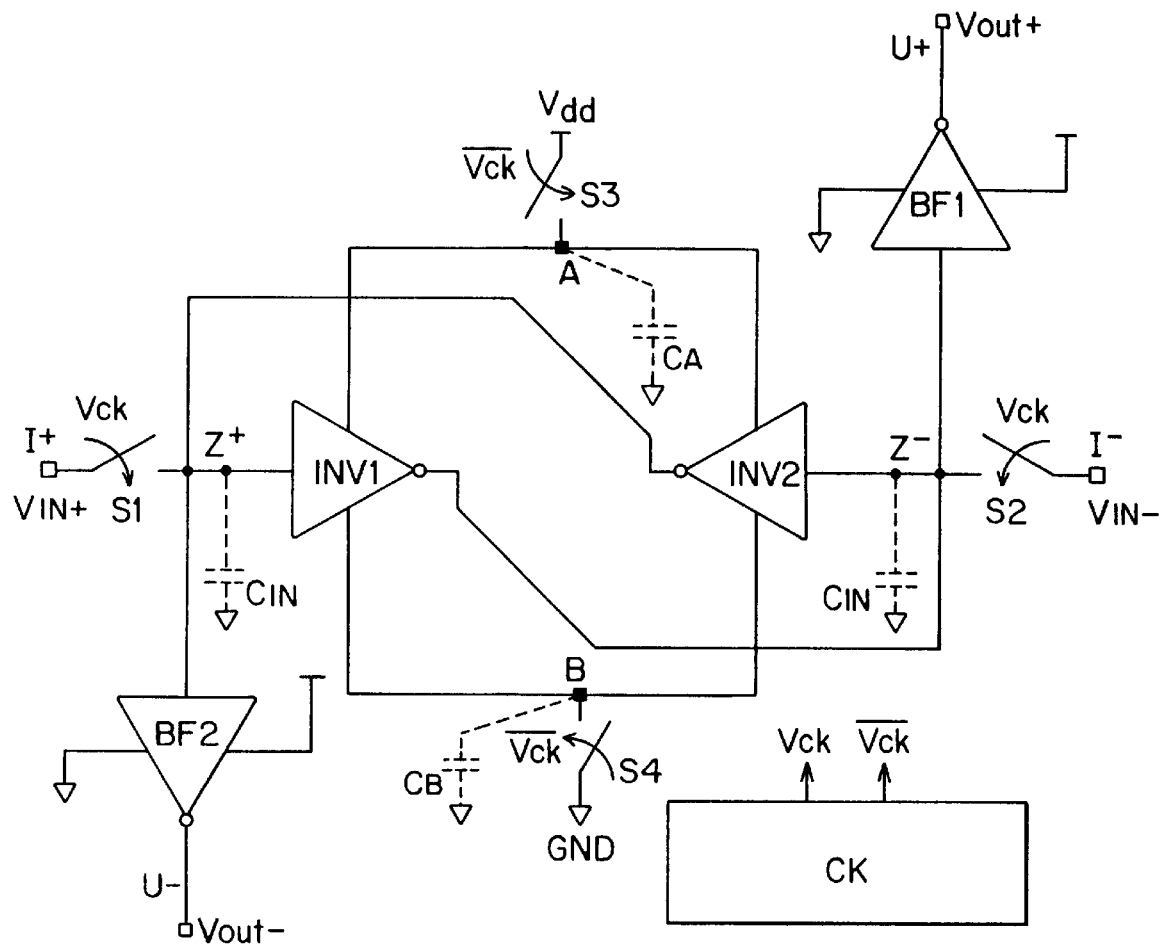
FIG. 2 is a block diagram of a known latch.

The known circuit in FIG. 2 represents a latch usable in a comparator according to FIG. 1. It includes two inverters INV1 and INV2 connected together in positive feedback, that is to say each with its output connected to the input of the other.

The input of the inverter INV1 is connected, at a node Z+, not only to the output of the inverter INV2, but also to a first signal input of the circuit, indicated I+, via a first controlled electronic switch S1. Similarly, the input of the inverter INV2 is connected, at a node Z− not only to the output of the inverter INV1, but also to a second signal input of the circuit, indicated I− via a second controlled electronic switch S2.

The outputs of the inverters INV1 and INV2 connected to the inputs Z− and Z+ are also each connected to the input of a respective separator circuit or buffer, respectively indicated BF1 and BF2, the outputs U+ and U− of which respectively constitute first and second signal outputs from the circuit. The supply terminals of the two inverters are joined at two nodes A and B and are respectively connected to the positive voltage supply terminal Vdd via a third controlled electronic switch S3, and to ground GND via a fourth controlled electronic switch S4. The buffers BF1 and BF2 have respective supply terminals connected to the supply voltage Vdd and to ground. The control terminals of the controlled electronic switches are connected to a timing signal generator or clock indicated CK.

In FIG. 2 there are also shown, in broken lines, two capacitors $C_{IN}$ which represent the input capacitances of the two inverters and two capacitors $C_A$ and $C_B$ which represent the parasitic capacitances associated with the two nodes A and B.

A circuit similar to that described above is illustrated for example in the article published in the IEEE Journal of solid-state circuits, Vol. 27, No. 12, December 1992, page 1916–1926.

The operation of the circuit of FIG. 2 takes place in two phases, a sampling phase and an evaluation phase.

During the sampling phase, the switches S1 and S2 are closed and the switches S3 and S4 are opened by the effect of respective control signals $V_{ck}$ and $V_{ck'}$ generated by the clock CK, applied to their control terminals. In these conditions, the two inverters are not supplied, whilst their inputs are connected to the input terminals I+ and I− of the circuit to which are applied two voltages $V_{IN+}$ and $V_{IN-}$ to be evaluated, which can differ by a small amount from one another (for example 1 mV). These voltages charge the input capacitances $C_{IN}$ of the two inverters.

In the subsequent evaluation phase, the switches S1 and S2 are open and the switches S3 and S4 are closed. In these conditions the inverters are supplied and therefore the positive feedback between them is active, the latch is insensitive to possible variations in the input voltages and at the outputs U+ and U− appear two voltages Vout+ and Vout− which, by the effect of the regenerative action of the positive feedback, differ from one another by an amount even up to several hundreds of times greater than the differential input voltage. These voltages are available at the outputs for the whole of the duration of the clock signal $V_{ck}$.

It has been ascertained that the precision with which the comparator performs the comparison during the evaluation phase depends principally on the latch input offset voltage at the end of the sampling phase. It has also been ascertained that this offset voltage increases with an increase in the switching frequency of the latch so that the use of such latches in a comparator is limited to applications in which the comparison frequency does not exceed a certain value (for example about 40 MHz). The inventors have determined that this dependence of the offset on the frequency is attributed to a positive feedback also being set up during the sampling phase because of the parasitic capacitance associated with the nodes A and B of the circuit, indicated $C_A$ and $C_B$ in FIG. 2, and therefore have modified the known circuit of FIG. 2 in the manner shown in FIG. 3.

Figure 5:
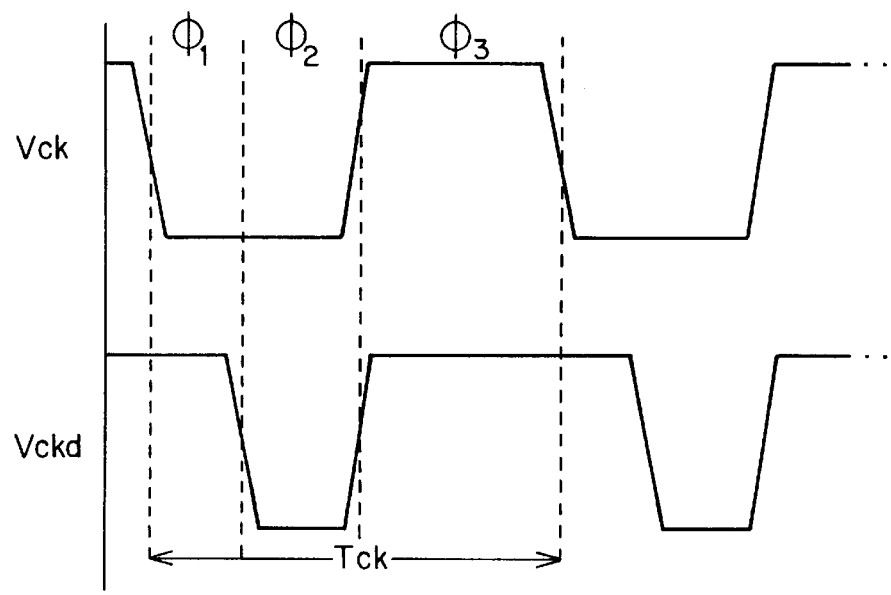
FIG. 5 is a timing diagram of two timing signals useful to illustrate the operation of the latch according to the invention.
Figure 3:
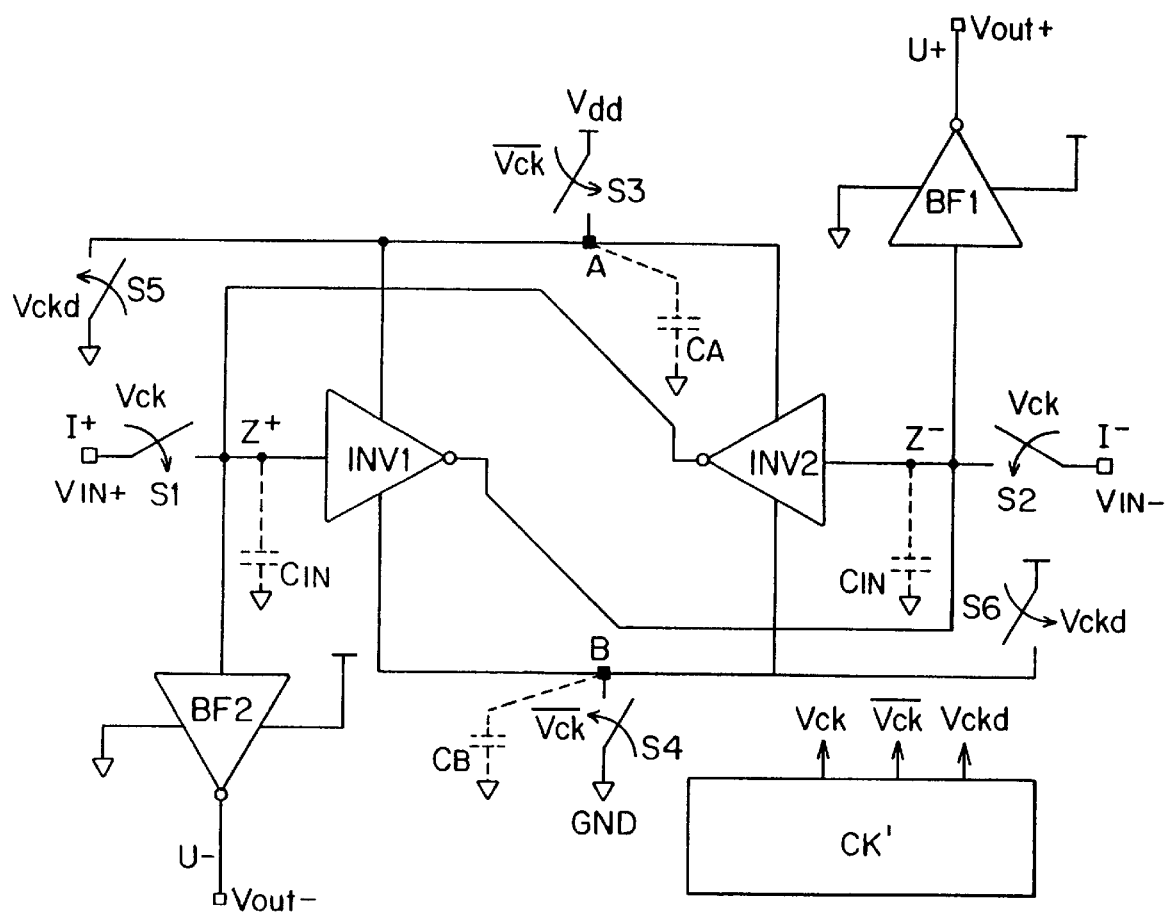
FIG. 3 is a block diagram of a latch according to the invention.

As is seen, the latch shown in FIG. 3, where components which are the same as those of FIG. 2 are indicated with the same reference symbols, has a fifth and a sixth controlled electronic switch, indicated S5 and S6, respectively connected between the node A and ground and between the node B and the supply terminal Vdd. The control terminals of the two switches are connected to the timing generator, indicated CK'. The timing generator is able to generate, as well as the clock signals $V_{ck}$ and Vck' as in the case of the circuit of FIG. 2, a clock signal $V_{ckd}$, for controlling the switches S5 and S6 which is different from the signal $V_{ck}$ only because its falling edge is delayed by a predetermined time with respect to the falling edge of the signal $V_{ck}$. The operation of the circuit in a clock period $T_{ck}$ is characterized by the following phases:

first sampling phase: this phase, indicated $\phi_1$ in FIG. 5 is similar to the sampling phase in the known circuit in that the switches S1 and S2 are closed and the switches S3 and S4 are open by the effect of the clock signals $V_{ck}$ and $V_{ck'}$ applied to their control terminals and the signals $V_{IN-}$ and $V_{IN+}$ charge the input capacitances $C_{IN}$ of the latch; during this phase the switches S5 and S6 are open;

second sampling phase: during this phase, indicated $\phi_2$ in FIG. 5, the switches S1, S2, S3 and S4 stay in the same conditions as in the first phase, whilst the switches S5 and S6 are closed; this allows the parasitic capacitances $C_A$ and $C_B$ to be discharged thus preventing the initiation of a positive feedback during the sampling phase;

evaluation phase: this phase, indicated $\phi_3$ in FIG. 5, is similar to the evaluation phase in the known circuit; note that the switches S5 and S6 are controlled to open at the beginning of this phase, that is to say when the switches S1 and S2 open and the switches S3 and S4 close, but could also be opened at a predetermined instant before the commencement of the phase $\phi_3$, naturally provided that it is after the discharge of the capacitances $C_A$ and $C_B$.

It has been ascertained that the circuit according to the invention does not allow the initiation of positive feedback before the evaluation phase and minimizes the equivalent transconductance of the inverters of the latch. Thus the frequency-dependent component of the input offset voltage of the latch is practically nullified and the total offset voltage $V_{OSL}$ of the latch is lower than that of the known circuit and substantially constant even at high frequencies.

A latch according to the invention utilized in a comparator such as that shown in FIG. 1 allows comparison frequencies up to 200 MHZ to be achieved.

Figure 4:
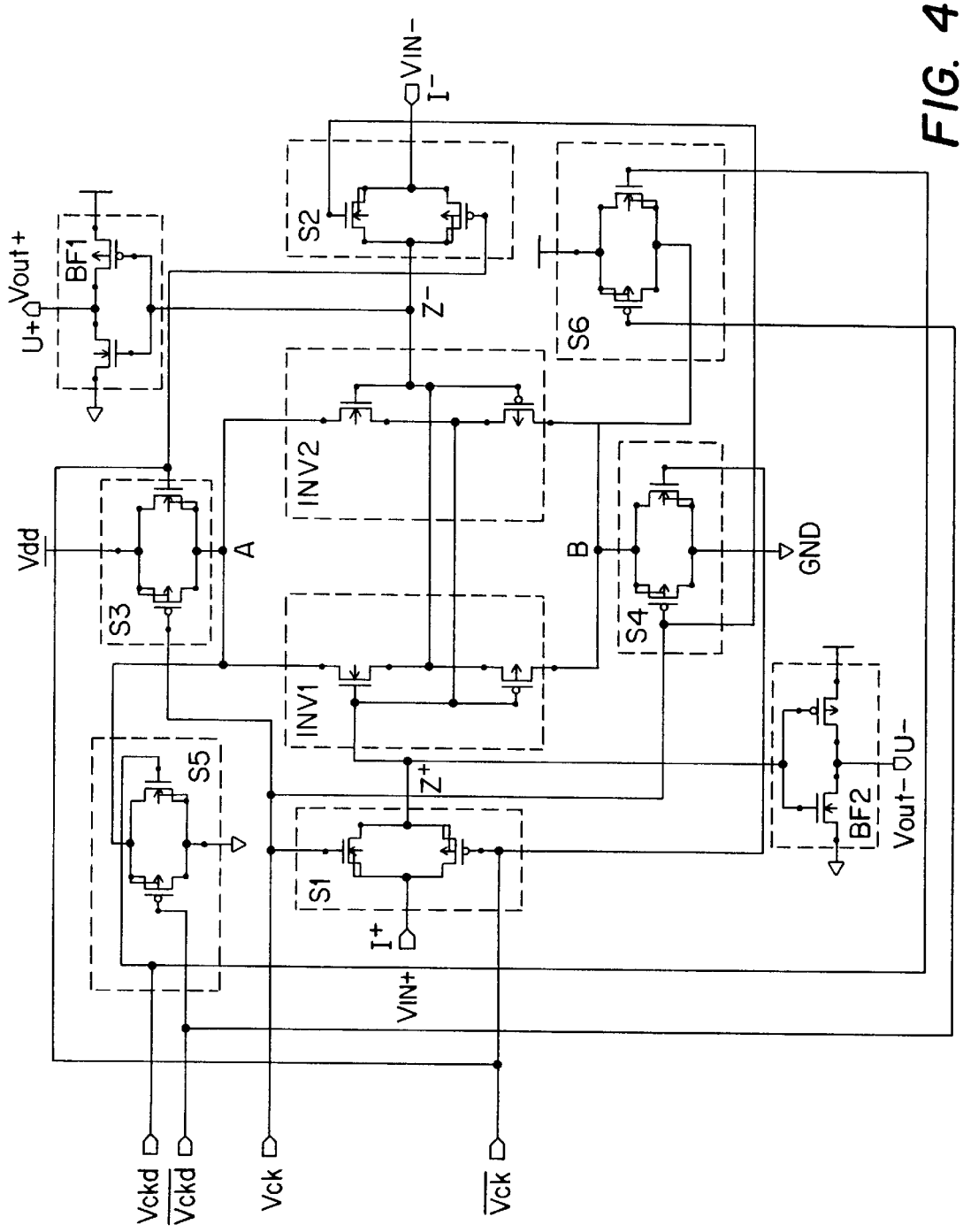
FIG. 4 is a circuit diagram of a latch according to the invention.

FIG. 4 shows a CMOS circuit diagram of the latch represented in block schematic form in FIG. 3. To facilitate understanding thereof the various circuit groups corresponding to the blocks of FIG. 3 are indicated with the same reference symbols as in FIG. 3.

In FIG. 4 the timing circuit or clock CK' is not shown in that it is of known type. The single characteristic aspect of the clock CK', clearly within the scope of the man skilled in the art, is constituted by the presence of a delay element to derive the delayed clock signal $V_{ckd}$.

Moreover, it is to be noted that in the circuit of FIG. 4, the electronic switches S1–S6 are formed as transfer gates. This not only allows any interference of the timing signals on the latch (clock-feedthrough) to be avoided, but also obtains a completely symmetrical structure since the "buffers" which provide the timing signals have in this case the same capacitive charge. To simplify the circuit, however, it would also be possible to utilize simple transistors (pass transistors) as the electronic switches.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A timed bistable circuit having two supply terminals;

a first and a second signal input;

a first and a second signal output; a first and a second inverter each having its input connected to the output of the other inverter, to the first and the second signal output respectively via a first and a second separator circuit respectively and to the first and second signal input respectively via a first and a second controlled electronic switch respectively and each having two supply terminals connected to the circuit supply terminals via first controlled switch means;

timing means operable to control the first and the second controlled electronic switch to open or close simultaneously and to control the first controlled switch means to close or open when the first and second electronic switches are both open or both closed respectively, second controlled switch means operable to connect the two supply terminals of the inverters respectively to the first and to the second circuit supply terminal, and wherein the timing means are operable to control the second controlled switch means to close with a predetermined delay with respect to the closure of the first and second controlled electronic switches and to open at a predetermined instant not later than the opening of the first and second controlled electronic switches.

2. A timed bistable circuit according to claim 1, in which the predetermined instant coincides with the opening of the first and second controlled electronic switches.

3. A timed bistable circuit according to claim 1, in which the first controlled switch means include third and fourth controlled electronic switches and in which the second controlled switch means include fifth and sixth controlled electronic switches.

4. A timed bistable circuit according to claim 3, in which the first to sixth controlled electronic switches each comprise transfer gates.

5. A comparator including a timed bistable circuit according to claim 1, a differential amplifier connected to the inputs of the timed bistable circuit and a flip-flop connected to the outputs of the timed bistable circuit, the inputs of the differential amplifier being the inputs of the comparator and one of the outputs of the flip-flop being the output of the comparator.

* * * * *